(12) United States Patent
Moberg

(10) Patent No.: US 8,415,988 B2
(45) Date of Patent: Apr. 9, 2013

(54) CLOCK DRIVER FOR A CAPACITANCE CLOCK INPUT

(75) Inventor: Gregory O. Moberg, Rochester, NY (US)

(73) Assignee: Truesense Imaging, Inc., Rochester, NY (US)

( * ) Notice: Subject to any disclaimer, the term of this patent is extended or adjusted under 35 U.S.C. 154(b) by 43 days.

(21) Appl. No.: 13/043,809

(22) Filed: Mar. 9, 2011

(65) Prior Publication Data
US 2012/0025887 A1 Feb. 2, 2012

Related U.S. Application Data

(60) Provisional application No. 61/368,746, filed on Jul. 29, 2010.

(51) Int. Cl.
*H03B 1/00* (2006.01)

(52) U.S. Cl. ........ 327/108; 327/109; 327/484; 327/291; 327/299

(58) Field of Classification Search .................. 327/313, 327/314, 321, 382, 383, 478, 482, 484, 108–112
See application file for complete search history.

(56) References Cited

U.S. PATENT DOCUMENTS

| | | | | |
|---|---|---|---|---|
| 4,486,672 A | * | 12/1984 | Nishimura et al. | 327/108 |
| 5,534,810 A | * | 7/1996 | White | 327/308 |
| 6,703,883 B2 | * | 3/2004 | West et al. | 327/291 |

* cited by examiner

*Primary Examiner* — An Luu
(74) *Attorney, Agent, or Firm* — Howard & Howard Attorneys PLLC

(57) ABSTRACT

A circuit that produces a clocking signal for a low to medium capacitance input of a device includes a drive gate connected to a common-base bi-polar driver circuit. The output of the drive gate is connected to an emitter of an NPN bi-polar transistor through one coupling capacitor and to an emitter of a PNP bi-polar transistor through another coupling capacitor. The transistors are connected in a common-base configuration with the collectors of the transistors connected together. One voltage is connected to the base of the PNP transistor. Another voltage is connected to the base of the NPN transistor. A diode is connected in parallel with the base-emitter of the PNP transistor. Another diode is connected in parallel with the base-emitter of the NPN transistor. A damping resistor is connected between the collectors of the transistors and the low to medium capacitance clock input of the device.

5 Claims, 6 Drawing Sheets

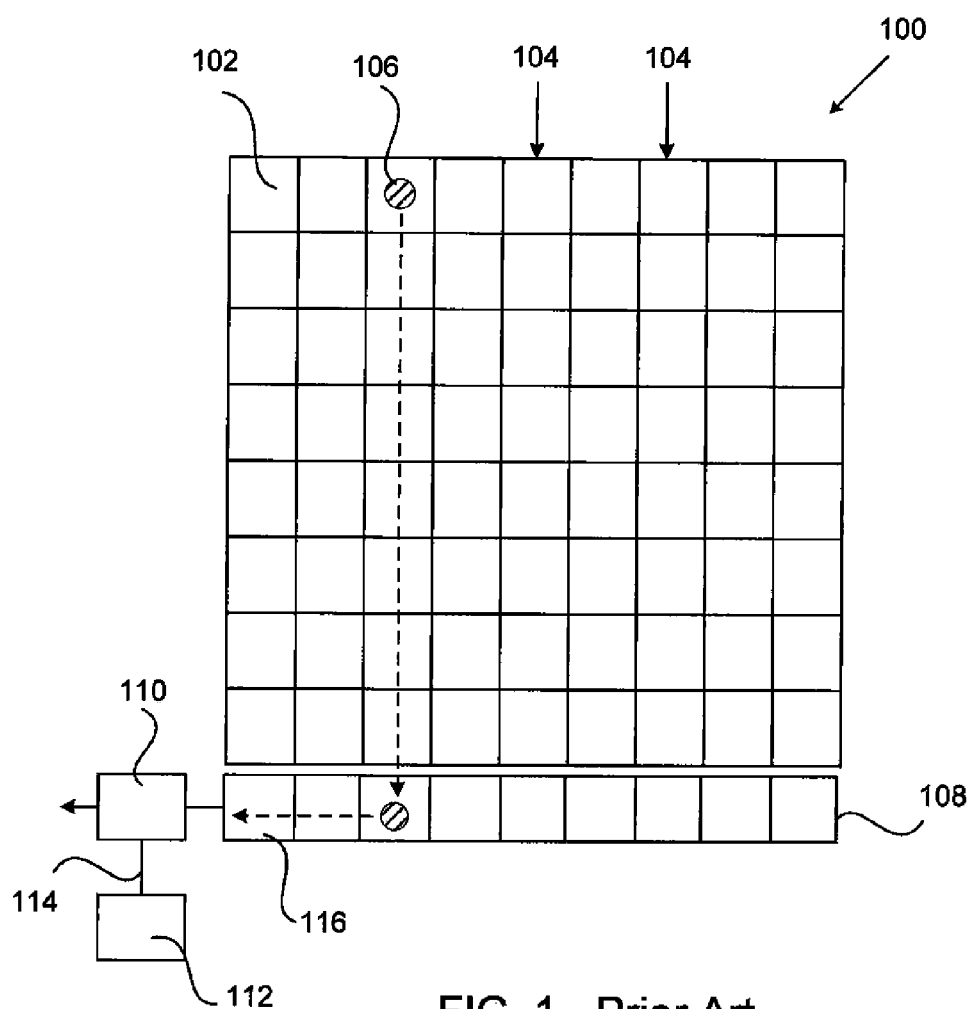
FIG. 1 - Prior Art
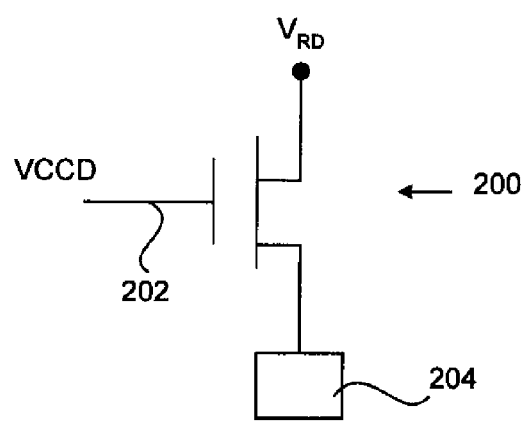
FIG. 2 - Prior Art

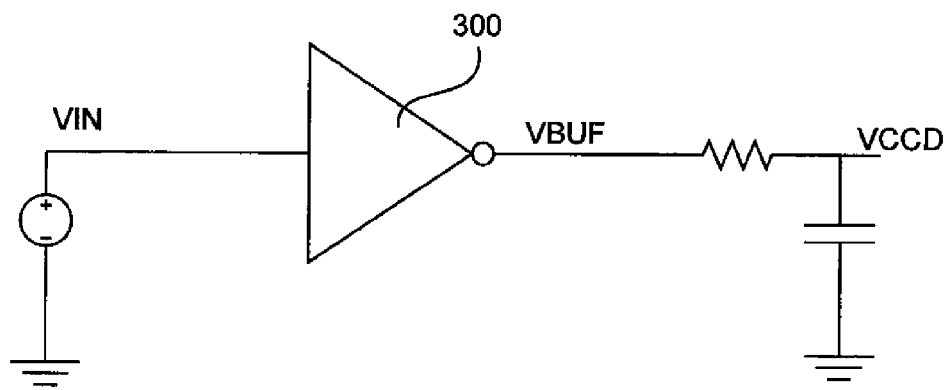
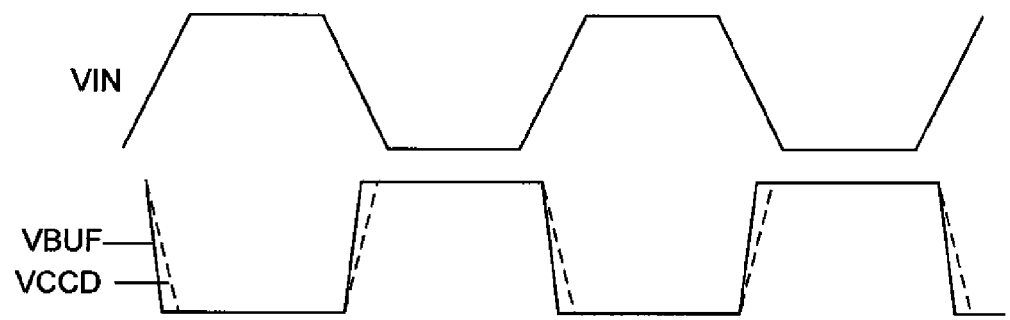
FIG. 3

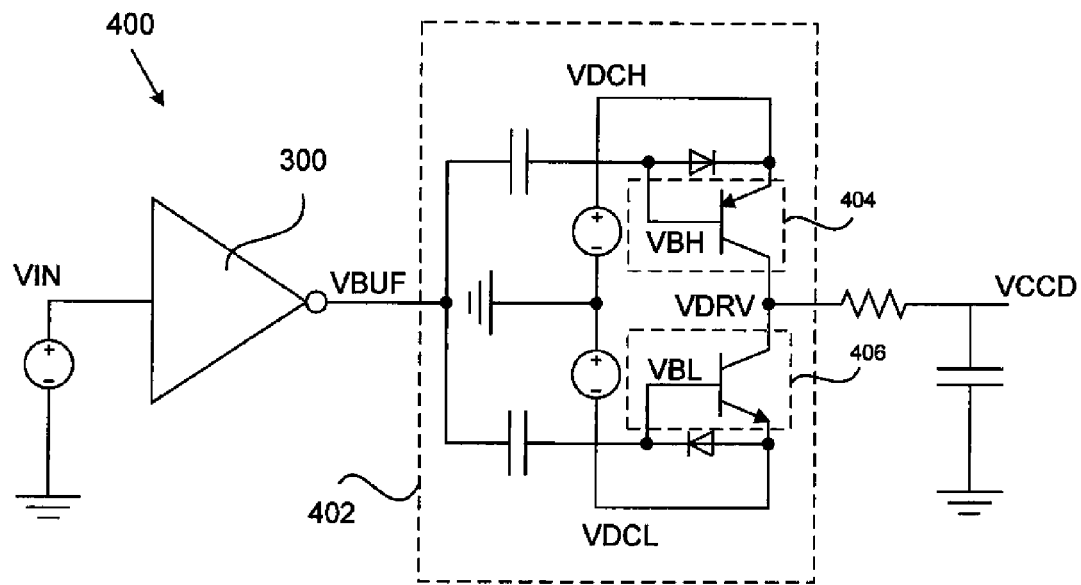
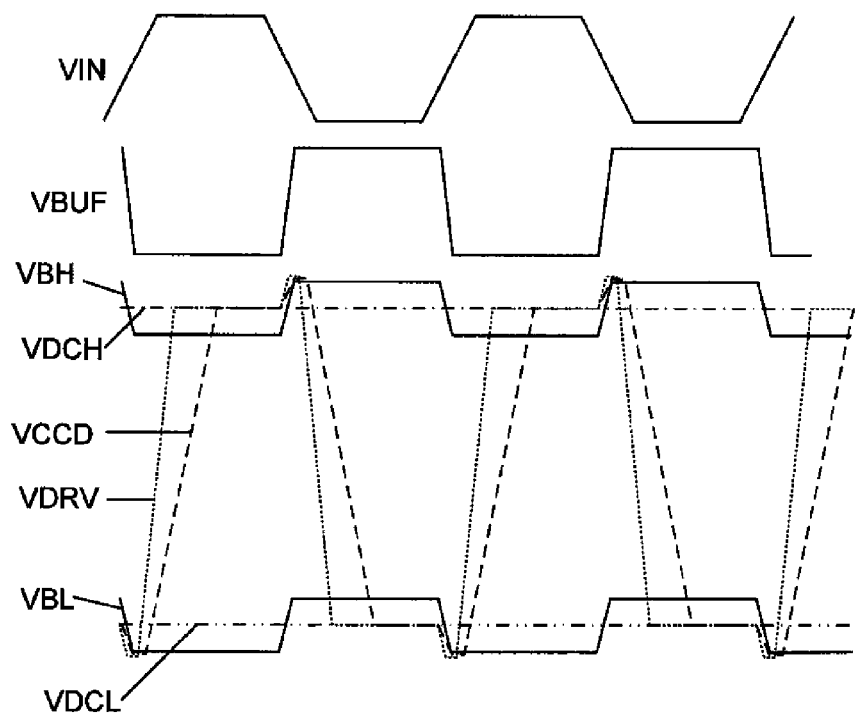
FIG. 4

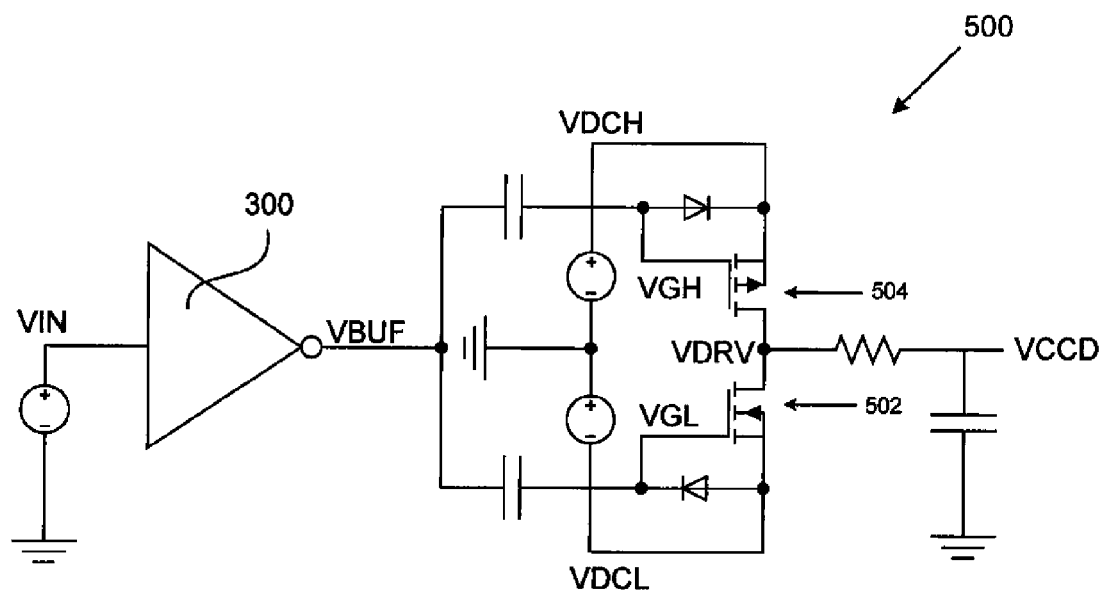
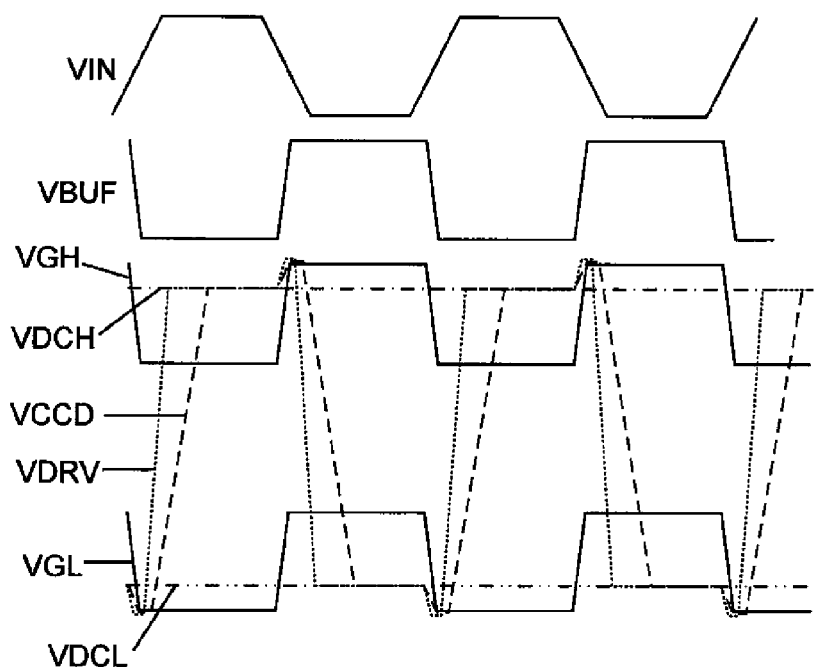
FIG. 5

CLOCK DRIVER FOR A CAPACITANCE CLOCK INPUT

CROSS-REFERENCE TO RELATED APPLICATION

This application claims the benefit of U.S. Provisional Application 61/368,746 filed on Jul. 29, 2010.

TECHNICAL FIELD

The present invention relates generally to a circuit for producing a clocking signal for a capacitance clock input of a device.

BACKGROUND

FIG. 1 is a simplified top view of a charge-coupled device (CCD) image sensor according to the prior art. Image sensor 100 includes an array 101 of photosensitive areas 102 arranged in rows and columns. The photosensitive areas 102 collect charge carriers in response to light striking the array 101. Image sensor 100 is illustrated as a full frame image sensor, where photosensitive areas 102 also operate as shift elements in CCD vertical shift registers 104. Accumulated charge packets 106 are shifted one row at a time through the vertical shift registers 104 to the horizontal shift register 108. The charge packets 106 are then serially shifted through the horizontal shift register 108 to an output circuit 110.

Circuit 112 outputs a CCD clocking signal (VCCD) that is transmitted to output circuit 110 on signal line 114. The CCD clocking signal (VCCD) is input into a low to medium capacitance clock input that is used to reset a charge storage element to a known potential or voltage level. For example, a reset transistor 200 (see FIG. 2) can be included in output circuit 110, and the CCD clocking signal (VCCD) is received on the gate 202 of the reset transistor. The low to medium capacitance clock input includes the gate of the reset transistor 200. The charge storage element to be reset to a known potential (e.g., element 204) can be implemented as the last shift element 116 in horizontal shift register 108 or as a floating diffusion that receives charge from shift element 116.

FIG. 3 is a schematic diagram of a first circuit for producing a clocking signal for a capacitance clock input in accordance with the prior art. Drive gate 300 receives an input signal $V_{IN}$, inverts the $V_{IN}$ signal, and outputs a clocking signal VCCD. Drive gate 300 is power efficient and very fast, but is limited in the voltage swing it can produce. Generally, the voltage swing of drive gate 300 is limited to six volts due to the maximum supply voltage (VCC) rating.

FIG. 4 is a schematic diagram of a second circuit for producing a clocking signal for a capacitance clock input in accordance with the prior art. Circuit 400 includes drive gate 300 connected to a common-emitter bipolar driver circuit 402. Circuit 400 has good power efficiency and is capable of producing a larger voltage swing in $V_{CCD}$ than drive gate 300 is able to produce by itself. For example, the voltage swing for circuit 400 can be ten volts. But circuit 400 suffers from waveform distortion and speed limitations due to the inverting character of circuit 400.

FIG. 5 is a schematic diagram of a third circuit for producing a clocking signal for a capacitance clock input in accordance with the prior art. Circuit 500 uses two metal oxide semiconductor field-effect transistors 502, 504 (MOSFET) instead of NPN and PNP bi-polar transistors 404, 406 shown in FIG. 4. Circuit 500 operates more quickly and can produce even larger voltage swings than circuit 400. But circuit 500 suffers from waveform distortion, and due to the unavailability of small enough MOSFETS, requires too much gate drive power to use at frequencies above 25 MHz.

SUMMARY

A circuit that produces a clocking signal for a low to medium capacitance clock input of a device includes a drive gate and a common-base bi-polar driver circuit. The output of the drive gate is connected to an emitter of an NPN bi-polar transistor through a first coupling capacitor and to an emitter of a PNP bi-polar transistor through a second coupling capacitor. The NPN and PNP bi-polar transistors are connected in a common base configuration with the collectors of the transistors connected together. A first DC voltage is connected between a base of the PNP bi-polar transistor and ground, while a second DC voltage is connected between a base of the NPN bi-polar transistor and ground. The first DC voltage is larger than the second DC voltage. A first diode is connected in parallel with the base emitter of the PNP transistor, with an anode of the diode connected to the base of the PNP transistor. A second diode is connected in parallel with the base emitter of the NPN transistor, with a cathode of the diode connected to the base of the NPN transistor. A damping resistor is connected between the collectors of the NPN and PNP bi-polar transistors and the low to medium capacitance clock input of the device. The device can be any type of device, including, but not limited to, a charge-coupled device (CCD).

BRIEF DESCRIPTION OF THE DRAWINGS

Embodiments of the invention are better understood with reference to the following drawings. The elements of the drawings are not necessarily to scale relative to each other.

FIG. 1 is a simplified top view of a CCD image sensor according to the prior art;

FIG. 2 is a schematic diagram of a reset transistor;

FIG. 3 is a schematic diagram of a first circuit for producing a clocking signal for a capacitance clock input in accordance with the prior art;

FIG. 4 is a schematic diagram of a second circuit for producing a CCD clocking signal in accordance with the prior art;

FIG. 5 is a schematic diagram of a third circuit for producing a CCD clocking signal in accordance with the prior art;

DETAILED DESCRIPTION

Figure 6:
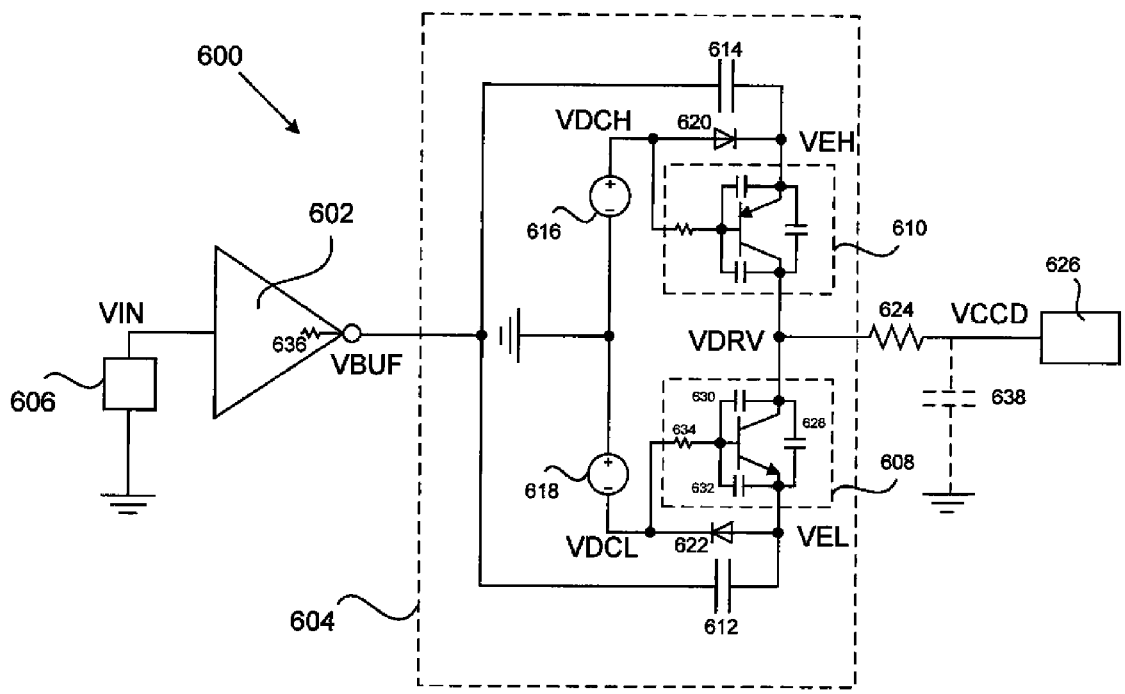
FIG. 6 is a schematic diagram of a circuit for producing a CCD clocking signal in an embodiment in accordance with the invention.

Throughout the specification and claims the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" means either a single component or a multiplicity of components, either active or passive, that are connected together to provide a desired function. The term "signal" means at least one current, voltage, or data signal.

Referring to the drawings, like numbers indicate like parts throughout the views.

The present invention is described herein in conjunction with a low to medium capacitance CCD clock input in an image sensor. Embodiments in accordance with the invention are not limited to this implementation. The present invention can be used to drive any device having a low to medium capacitance clock input, including, but not limited to, a capacitor.

FIG. 6 is a schematic diagram of a circuit for producing a CCD clocking signal in an embodiment in accordance with the invention. Circuit 600 includes drive gate 602 and common-base bi-polar driver circuit 604. Drive gate 602 is implemented as an inverter that receives an input signal $V_{IN}$ from clock source 606 in an embodiment in accordance with the invention. Drive gate 602 can be configured differently in other embodiments in accordance with the invention. For example, drive gate 602 can be implemented as a non-inverting buffer.

Common-base bi-polar driver circuit 604 includes NPN bi-polar transistor 608 and PNP bi-polar transistor 610. An output of drive gate 602 is connected to an emitter of an NPN bi-polar transistor 608 through coupling capacitor 612. The output of drive gate 602 is also connected to an emitter of a PNP bi-polar transistor 610 through coupling capacitor 614.

The NPN bi-polar transistor 608 and the PNP bi-polar transistor 610 are connected in a common-base configuration with the collectors of the transistors 608, 610 connected together. In the common-base configuration, the emitters of the bi-polar transistors 608, 610 serve as the input to the transistors 608, 610. The collectors of the transistors 608, 610 serve as the outputs. DC voltage supply 616 is connected to the base of PNP bi-polar transistor 610. DC voltage supply 618 is connected to the base of NPN bi-polar transistor 608. In the illustrated embodiment, the output of DC voltage supply 616 is larger than the output DC voltage supply 618.

Diode 620 is connected in parallel with the base-emitter of the PNP transistor 610, with an anode of the diode 620 connected to the base of the PNP transistor 610. Diode 622 is connected in parallel with the base-emitter of NPN transistor 608, with a cathode of the diode 622 connected to the base of the NPN transistor 608. Diodes 620, 622 are implemented as Shottky diodes in an embodiment in accordance with the invention. Damping resistor 624 is connected between the collectors of the NPN bi-polar transistor 608 and the PNP bi-polar transistor 610 and the low to medium capacitance CCD clock input 626.

As used herein, the term "clock input" refers to a capacitance input for a device. In the illustrated embodiment, the clock input is the low to medium capacitance CCD clock input 626. By way of example only, a low capacitance CCD clock input can be the reset gate or last horizontal phase input, which typically have a capacitance in the order of 20 pF. A medium capacitance CCD clock input can be a H-register of a CCD image sensor, which typically has a capacitance up to approximately 300 pF. For comparison, an exemplary high capacitance CCD clock input can be the V-registers of a CCD image sensor, which typically has a capacitance in the order of 10,000 pF or more. Alternatively, the H-register of a larger CCD image sensor can be a high capacitance CCD clock input having a capacitance greater than 300 pF.

The operation of circuit 600 will now be described for the NPN transistor section of the common-base bi-polar drive circuit 602. Since the NPN and PNP transistor sections of the common-base bi-polar drive circuit 602 are fully complementary, the description of the NPN transistor section applies to the PNP transistor section as well. At time T0 (see FIG. 7), the output node VBUF of drive gate 600 is in a high state, where the voltage is substantially greater than $V_{BE}+V_{SH}$. $V_{SH}$ represents the diode voltage for diode 622. The output node VDRV is in a high state, where the voltage is essentially the voltage of node VEH. The emitter of NPN bi-polar transistor 608 is one diode drop $V_{SH}$ above ground.

From time T0 to T1 (FIG. 7), the output node VBUF of drive gate 602 rapidly falls from the high state to ground. The output of drive gate 602 is connected to the emitter of NPN bi-polar transistor 608 by coupling capacitor 612, so the transition in VBUF causes the voltage at the emitter (VEL) of NPN bi-polar transistor 608 to fall rapidly. The transition in VEL is coupled across NPN bi-polar transistor 608 to the output node VDRV by the parasitic collector-emitter capacitance 628 plus the series connection of the parasitic collector-base capacitance 630 and the parasitic base-emitter capacitance 632. The parasitic base-emitter capacitance 632 is shunted to AC ground by parasitic base resistance 634.

Although NPN bi-polar transistor 608 does not turn on until the voltage at the emitter of NPN bi-polar transistor 608 falls to 1 $V_{BE}$ below ground, the signal capacitively coupled to the output node VDRV is in phase with the direction the output will move when NPN bi-polar transistor 608 does turns on. This is in contrast to the prior art common-emitter bipolar circuit shown in FIG. 2, where the capacitive feed through to the output is out of phase with the direction the output will move. Thus, the common-base bi-polar drive circuit 602 in circuit 600 does not have the signal distortion that is produced by the prior art circuits depicted in FIGS. 2 and 3.

Once the voltage at the emitter of NPN bi-polar transistor 608 falls to 1 $V_{BE}$ below ground, the emitter voltage clamps as NPN bi-polar transistor 608 turns on. At this point, the current in coupling capacitor 612 rises abruptly and begins to flow from the emitter of NPN bi-polar transistor 608. A fraction of the emitter current transfers to the collector, depending on the common-base current gain α. While at low frequencies α is very close to 1, at the high edge rates typically found in these drivers, α will be closer to 0.5. The falloff in α is the major loss in power efficiency of circuit 600.

Another parasitic effect occurs when NPN bi-polar transistor 608 turns on and the voltage at the collector of NPN bi-polar transistor 608 continues to fall. The other parasitic effect is the well-known Miller effect that results from the parasitic collector-base capacitance 630 and parasitic base resistance 634. These parasitic components increase the fall time of the collector of NPN bi-polar transistor 608. The severity of the effect is proportional to their product.

Those skilled in the art will recognize the Miller effect is also present in the prior art common-emitter bipolar circuit of FIG. 2. But in the prior art circuit, the resistance is the sum of the parasitic base resistance (e.g. resistance 634 in FIG. 6) and the parasitic drive gate output resistance (e.g., resistance 636 in FIG. 6). Since the parasitic drive gate output resistance is typically several times larger than the parasitic base resistance, the Miller effect is much smaller in the prior art common-base configuration.

When the voltage at the output node VDRV falls to the emitter voltage of NPN bi-polar transistor 608, NPN bi-polar transistor 608 enters saturation and the collector voltage ceases to fall. Coupling capacitor 612 continues to charge for a short amount of time until its current falls to zero. The voltage at node VDRV is then maintained by the node capacitance.

The value of coupling capacitor 612 is large enough to supply sufficient charge to load capacitor 638, to account for the charge lost to the current gain α of NPN bi-polar transistor 608, and to account for circuit tolerances. Load capacitor 638 represents the capacitance of CCD clock input 626. Coupling capacitor 612 preferably does not allow current to flow for much longer than the time required to bring node VDRV to the emitter voltage of NPN bi-polar transistor 608, as this represents wasted power. The first order design equation for the value of coupling capacitor 612 (Ccoupling) is:

$$Ccoupling=(Cvccd)(\Delta Vccd)/[(\alpha)(\Delta VBUF-(V_{BE}+V_{SH}))]$$ (Equation 1)

Examining Equation 1, it can be seen that the required value of coupling capacitor 612 increases as load capacitor 638 and load voltage swing increase, and as α and the gate output swing decrease. The ($V_{BE}+V_{SH}$) term is due to the coupling capacitor current being zero on a first order basis while the emitter voltage transitions between $-1 V_{BE}$ and one Shottky diode drop $V_{SH}$ in an embodiment in accordance with the invention.

Damping resistor 624 is provided to eliminate any ringing in circuit 600 due to parasitic inductances. Damping resistor 624 also rolls off the waveform at node VCCD, increasing the settling time of node VCCD to T2 (see FIG. 7).

Figure 7:
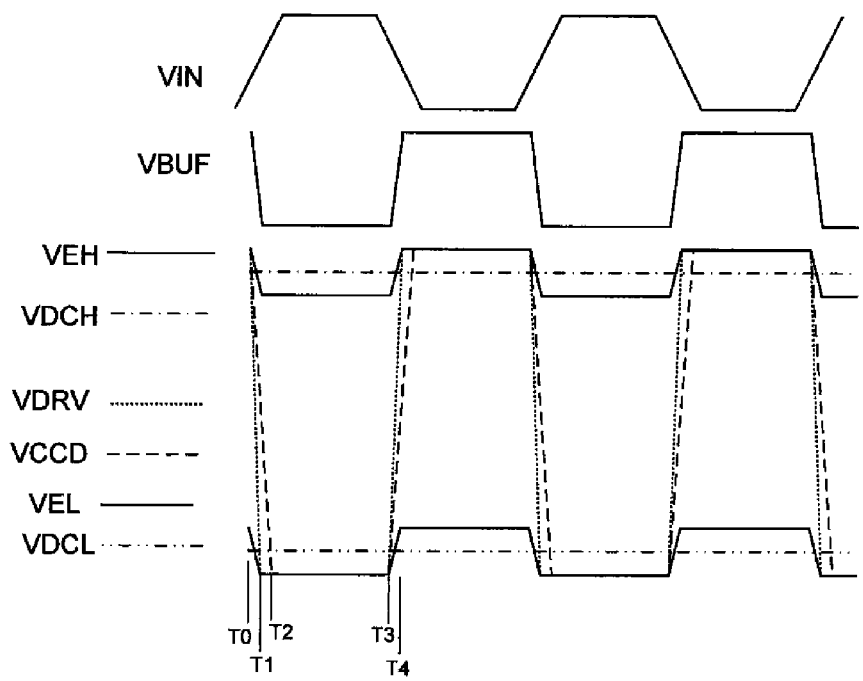
FIG. 7 is an exemplary timing diagram for the circuit shown in FIG. 6.

The rising transition of node VDRV begins at time T3 (FIG. 7). Since coupling capacitor 612 is sized so that the emitter current of NPN bi-polar transistor 608 has substantially reached zero, there is little or no stored charge in the base region of NPN bi-polar transistor 608 to cause a turn-off delay. From time T3 to time T4, the output voltage VBUF of drive gate 602 rapidly rises from ground to a high state. This transition in VBUF is coupled to the emitter of NPN bi-polar transistor 608 by coupling capacitor 612, so that the voltage at the emitter (VEL) of NPN bi-polar transistor 608 rises rapidly. This transition in VEL is coupled across NPN bi-polar transistor 608 to the output node VDRV by the parasitic collector-emitter capacitance 628 plus the series connection of the parasitic collector-base capacitance 630 and the parasitic base-emitter capacitance 632. Similar to the negative transition, the coupling to output node VDRV is in phase with the direction the output will move when PNP bi-polar transistor 610 turns on.

Once the voltage VEL at the emitter of NPN bi-polar transistor 608 rises to 1 $V_{SB}$ above ground, the emitter voltage clamps as Shottky diode 622 turns on. At this point, the current in coupling capacitor 612 rises abruptly, flows into diode 612, and then falls to zero as coupling capacitor 612 is recharged to be ready for the next falling edge. NPN bi-polar transistor 608 will again turn on at the next falling edge.

Node VDRV is pulled up by PNP bi-polar transistor 610 operating in complementary fashion to NPN bi-polar transistor 608 turn-on transient. It is possible that NPN bi-polar transistor 608 may experience the Miller effect while the voltage at the collector of NPN bi-polar transistor 608 rises, but the external reverse bias of the emitter of NPN bi-polar transistor 608 will prevent or minimize the Miller effect. The voltage at node VDRV is maintained by its node capacitance after PNP bi-polar transistor 610 turns off.

In one embodiment in accordance with the invention, the low state of node VDRV is one (1) $V_{BE}$ below the value of the bias supply VDCL. In another embodiment in accordance with the invention, a reference generator is designed and used with DC voltage supply 618 so that the low state of node VDRV is VDC+$V_{BE}$ to compensate for the base-emitter drop of NPN bi-polar transistor 608. A similar reference generator can be designed for use with PNP bi-polar transistor 610.

Figure 8:
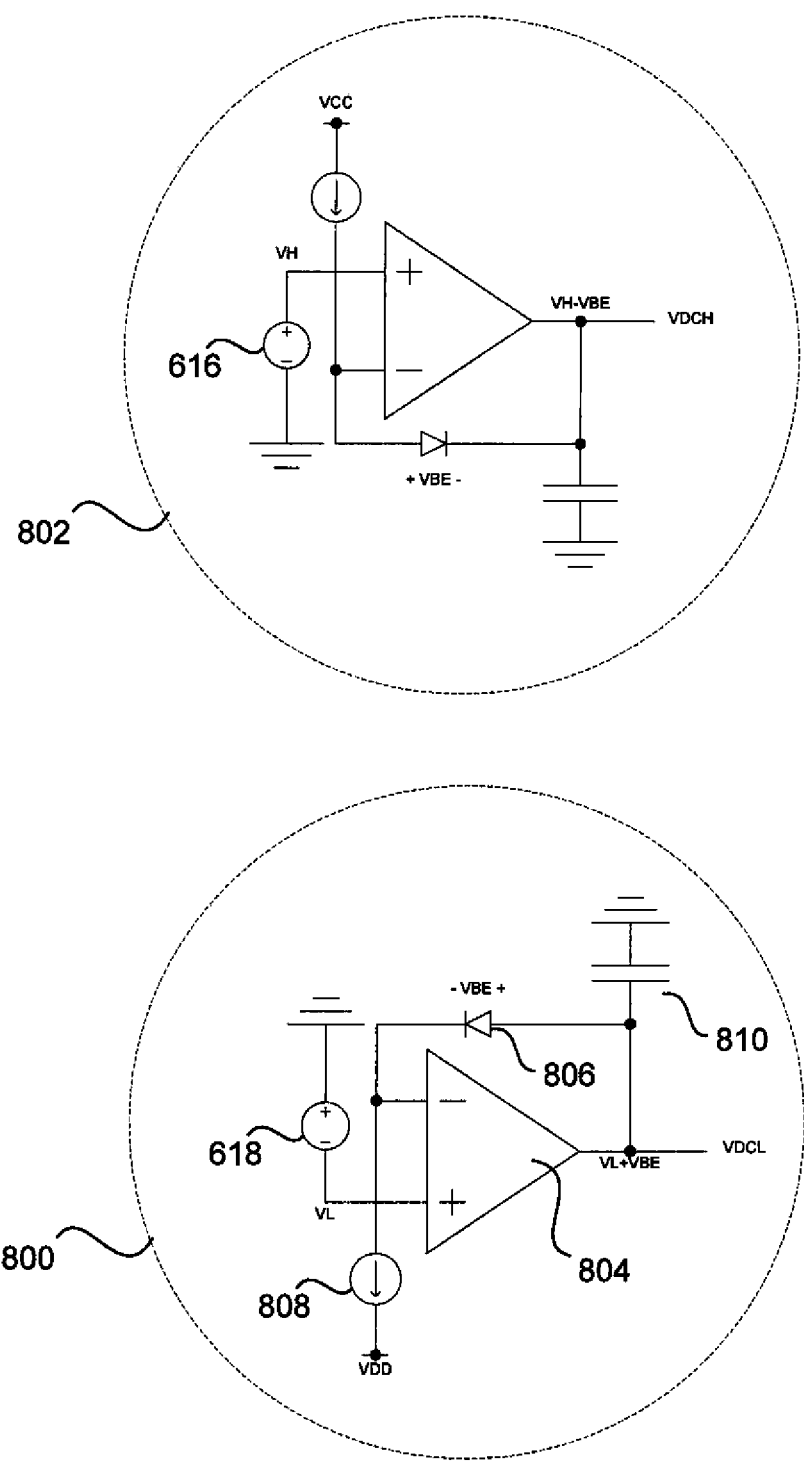
FIG. 8 is a schematic diagram of two temperature compensated reference generators suitable for use in circuit 600 shown in FIG. 6 in an embodiment in accordance with the invention.

FIG. 8 is a schematic diagram of exemplary temperature compensated reference generators suitable for use in circuit 600 shown in FIG. 6 in an embodiment in accordance with the invention. As previously described, the output of the circuit shown in FIG. 6 has a high level output of VDCH+1VBE and a low output of VDCL-1VBE in an embodiment in accordance with the invention. The DC voltage supplies 618 and 616 have levels that are a DC voltage+/-1VBE, respectively. If these voltage levels are used, the low level output of the circuit shown in FIG. 6 is VL+1VBE-1VBE=VL, and the high level output of the circuit is VH-1VBE+1VBE=VH. Since there is no term in levels VL and VH involving VBE, the output of the circuit is independent of both the absolute and temperature change in the value of VBE.

Reference generator 800 can be used in place of DC voltage supply 618 in FIG. 6 while reference generator 802 can be used in place of DC voltage supply 616. A description of the operation of reference generator 800 explains the operation of reference generator 802 because the two bi-polar transistors 608, 610 are complementary. Operational amplifier 804 is configured as a unity gain follower where the output equals VL (here shown <0V) plus the forward drop of diode 806. Diode 806 can be either a true PN junction diode or a diode-connected transistor where the transistor is of the same type as transistor 608 in FIG. 6. In a diode-connected transistor, the collector is connected to the base, and the diode forward voltage appears between the base/collector and emitter terminals. If a diode-connected transistor is used, the diode-connected transistor may better match the characteristics of transistor 608 than a PN junction diode.

Current sink 808 provides the forward current that generates the forward drop. Capacitor 810 provides a low impedance path to ground at high frequencies, and operational amplifier 804 provides the required load current and accurate voltage.

The invention has been described in detail with particular reference to certain preferred embodiments thereof, but it will be understood that variations and modifications can be effected within the spirit and scope of the invention. And even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 image sensor
101 array
102 photosensitive area
104 vertical shift register
106 charge packet
108 horizontal shift register
110 output circuit
112 circuit
114 signal line
116 last shift element
200 reset transistor
202 gate of reset transistor
204 charge storage element
300 drive gate
400 circuit
402 common-emitter bipolar driver circuit
404 PNP bi-polar transistor
406 NPN bi-polar transistor 500 circuit
502 MOSFET transistor
504 MOSFET transistor
600 circuit
602 drive gate
604 common-base bipolar driver circuit
606 clock source
608 NPN bi-polar transistor
610 PNP bipolar transistor
612 coupling capacitor
614 coupling capacitor
616 DC voltage supply
618 DC voltage supply
620 diode
622 diode
624 damping resistor
626 CCD clock input
628 parasitic collector-emitter capacitance
630 parasitic collector-base capacitance
632 parasitic base-emitter capacitance
634 parasitic base resistance
636 parasitic drive gate output resistance
638 load capacitor representing the CCD clock input capacitance
800 reference generator for NPN bi-polar transistor
802 reference generator for PNP bi-polar transistor
804 operational amplifier
806 diode
808 current sink
810 capacitor

What is claimed is:

1. A circuit for producing a clocking signal for a capacitance clock input of a device, the circuit comprising:
    an output of a drive gate connected to an emitter of an NPN bi-polar transistor through a first coupling capacitor and connected to an emitter of a PNP bi-polar transistor through a second coupling capacitor, wherein the NPN bi-polar transistor and the PNP bi-polar transistor are connected in a common base configuration with collectors of the NPN and PNP bi-polar transistors connected together;
    a first DC voltage supply connected to a base of the PNP bi-polar transistor;
    a second DC voltage supply connected to a base of the NPN bi-polar transistor, wherein a signal produced by the first DC voltage supply is larger than a signal produced by the second DC voltage supply;
    a first diode connected in parallel with the base emitter of the PNP bi-polar transistor with an anode of the diode connected to the base of the PNP bi-polar transistor;
    a second diode connected in parallel with the base emitter of the NPN bi-polar transistor with a cathode of the diode connected to the base of the NPN bi-polar transistor; and
    a damping resistor connected between the collectors of the NPN and PNP bi-polar transistors and the capacitance clock input of the device.

2. The circuit of claim 1, wherein the capacitance clock input comprises a last shift element of a horizontal shift register.

3. The circuit of claim 1, wherein the capacitance clock input comprises a gate of a reset transistor.

4. A circuit for producing a clocking signal for a capacitance clock input of a device, the circuit comprising:
    an output of a drive gate connected to an emitter of an NPN bi-polar transistor through a first coupling capacitor and connected to an emitter of a PNP bi-polar transistor through a second coupling capacitor, wherein the NPN bi-polar transistor and the PNP bi-polar transistor are connected in a common base configuration with collectors of the NPN and PNP bi-polar transistors connected together;
    a first reference generator connected to a base of the PNP bi-polar transistor;
    a second reference generator connected to a base of the NPN bi-polar transistor, wherein a signal produced by the first reference generator is larger than a signal produced by the second reference generator;
    a first diode connected in parallel with the base emitter of the PNP bi-polar transistor with an anode of the diode connected to the base of the PNP bi-polar transistor;
    a second diode connected in parallel with the base emitter of the NPN bi-polar transistor with a cathode of the diode connected to the base of the NPN bi-polar transistor; and
    a damping resistor connected between the collectors of the NPN and PNP bi-polar transistors and the capacitance clock input of the device.

5. The circuit of claim 4, wherein (i) the first reference generator is configured to compensate for a temperature-dependent base-emitter voltage of the PNP bi-polar transistor and (ii) the second reference generator is configured to compensate for a temperature-dependent base-emitter voltage of the NPN bi-polar transistor.

* * * * *